United States Patent [19]
Fukui

[11] Patent Number: 5,701,255
[45] Date of Patent: Dec. 23, 1997

[54] CELL GENERATION METHOD AND CELL GENERATION SYSTEM

[75] Inventor: Masahiro Fukui, Osaka, Japan

[73] Assignee: Matsushita Electric Industrial Co., Ltd., Osaka, Japan

[21] Appl. No.: 527,318

[22] Filed: Sep. 12, 1995

[30] Foreign Application Priority Data

Sep. 14, 1994 [JP] Japan .................................. 6-220134
May 17, 1995 [JP] Japan .................................. 7-118176

[51] Int. Cl.$^6$ ...................................................... G06F 17/50
[52] U.S. Cl. ...................................... 364/491; 364/488
[58] Field of Search .................................. 364/488, 489, 364/490, 491

[56] References Cited

U.S. PATENT DOCUMENTS

| | | | |
|---|---|---|---|
| 4,593,363 | 6/1986 | Burstein et al. | 364/491 |
| 4,615,011 | 9/1986 | Linsker | 364/491 |
| 4,700,316 | 10/1987 | Nair | 364/488 |
| 4,745,084 | 5/1988 | Rowson et al. | 437/51 |
| 4,783,749 | 11/1988 | Duzy et al. | 364/491 |
| 5,097,422 | 3/1992 | Corbin, II et al. | 364/491 |
| 5,119,317 | 6/1992 | Narikawa et al. | 364/512 |
| 5,303,161 | 4/1994 | Burns et al. | 364/490 |
| 5,363,313 | 11/1994 | Lee | 364/491 |
| 5,375,069 | 12/1994 | Satoh et al. | 364/490 |
| 5,388,054 | 2/1995 | Tokumaru | 364/490 |

OTHER PUBLICATIONS

T. Uehara et al., Optimal Layout of CMOS Functional Arrays, IEEE Trans. on Computers, May, 1981, vol. C–30, No. 5, pp. 305–312.

S. Kirpatrick et al., Optimization by Simulated Annealing, Science, May, 1983, vol. 220, No. 4598, pp. 671–680.

H. Shin et al., Two–Dimensional Compaction by Zone Refining, Proc. of 23rd Design Automation Conference, 1986, pp. 115–22.

*Primary Examiner*—Kevin J. Teska
*Assistant Examiner*—Leigh Marie Garbowski
*Attorney, Agent, or Firm*—McDermott, Will & Emery

[57] ABSTRACT

Densely-packed leaf cells for semiconductor integrated circuits are generated. The placement of transistors in a leaf cell is determined, and wire routings between the transistors are found on a gridded plane, and a compaction operation is performed on a placement/wiring result on the gridded plane. More specifically, locations of transistors in a leaf cell are determined (i) by a step of initializing a transistor grouping arranged in accordance with diffusion sharing, (ii) by a step of modifying the transistor grouping, (iii) by a step of finding locations of transistor in the modified transistor grouping, (iv) by a step of evaluating a result of the step (iii); and (v) by a step of making a judgment of whether to accept a result of step (iii) according to a result of step (iv).

16 Claims, 14 Drawing Sheets

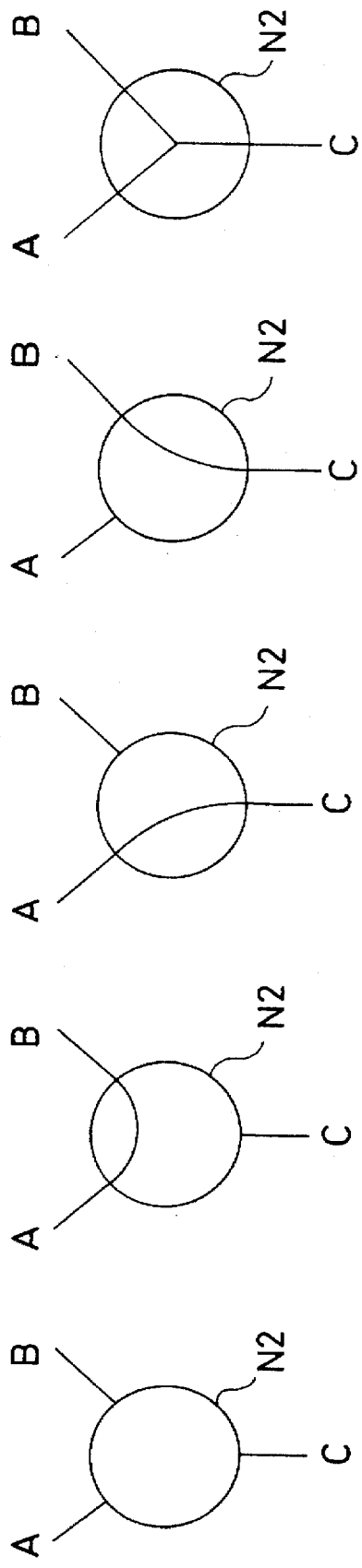

FIG. 13A
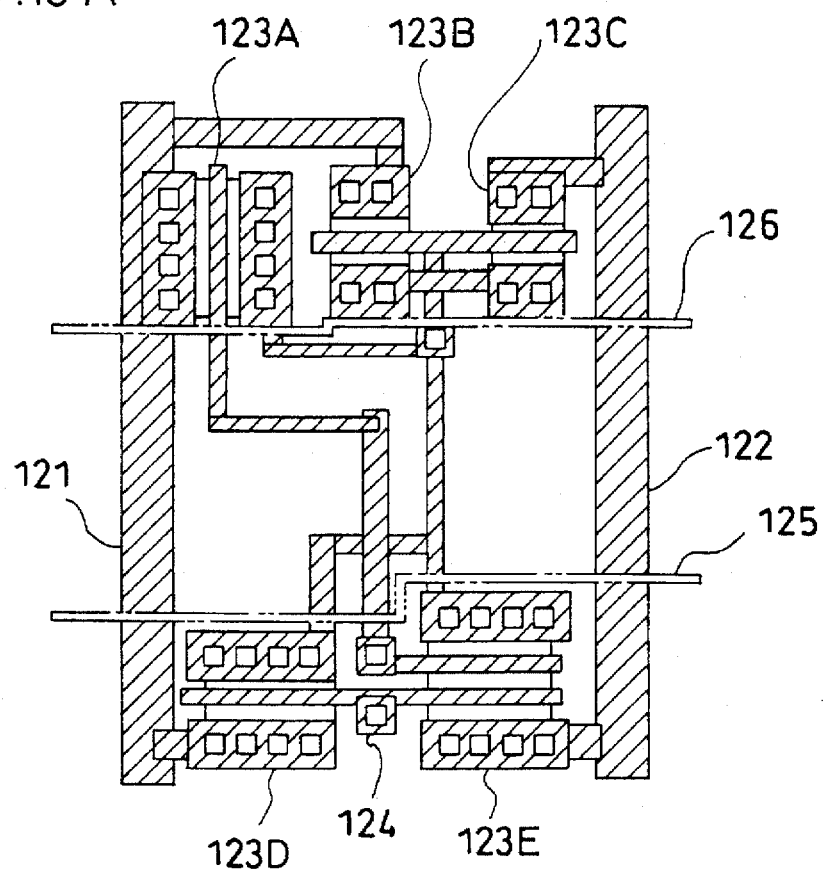
FIG. 13B
FIG. 13C
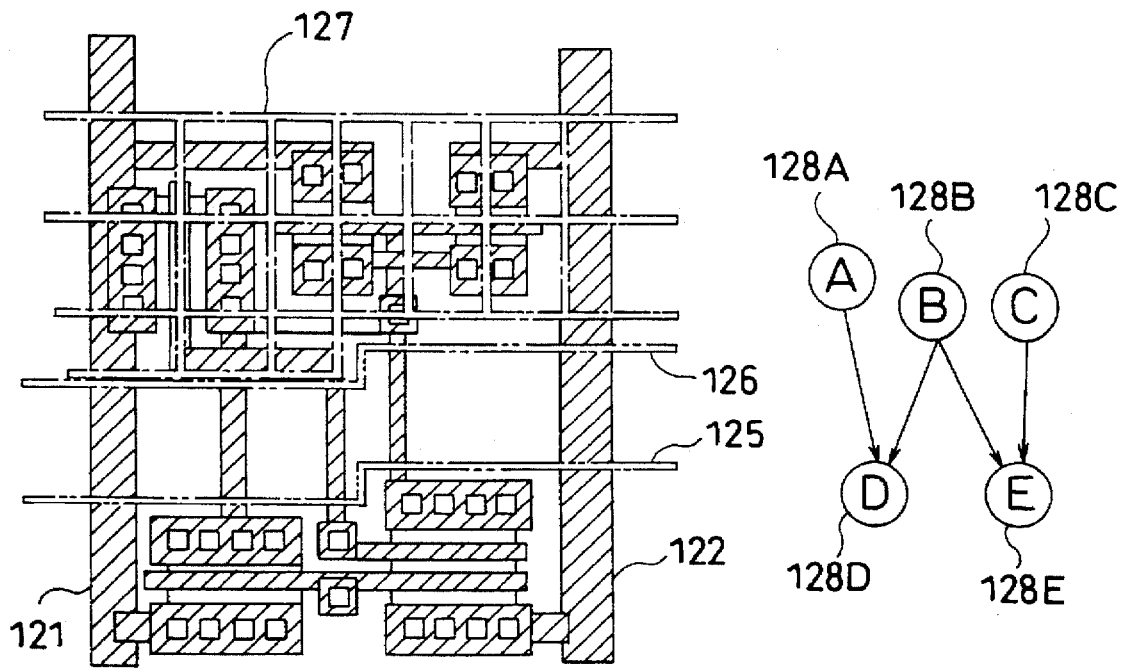

CELL GENERATION METHOD AND CELL GENERATION SYSTEM

BACKGROUND OF THE INVENTION

This invention relates generally to a method of generating VLSI leaf cells and particularly to layout generation of standard cells, I/O cells, data path cells or the like.

VLSI technology now enables the creation of semiconductor devices at the submicrometre level and has been far diversified. This results in increasing the amount of work needed to design leaf cells that are used as the basic unit for the design of VLSI masks. The semiconductor industry is therefore now trying to find a way of speeding up the development of VLSI with the aid of design automation.

In automatic generation of VLSIs, the leaf cell area is a key factor, since it affects not only the chip area but also the chip cost. Therefore, to achieve space-saving leaf cells, it is necessary to pack transistors in a leaf cell as many as possible, at least at the same density level that human designers can achieve. In order to generate a layout capable of packing circuits together as closely as possible, transistors must be placed at their optimum locations, and optimum wire routings for establishing connections between the transistors must be discovered, and layout compaction must be performed.

First, a conventional way of how to lay out transistors is explained. For example, in a VLSI made in accordance with CMOS technology, one leaf cell is composed of a plurality of MOS transistors. Each of the MOS transistors is implemented by a well known structure in which a gate of polysilicon is located in the center and diffusion areas of p- or n-type, i.e., source/drain regions, are formed such that they face each other across the polysilicon gate. When diffusion areas of two MOS transistors are needed to be connected together in the leaf cell generation, either a way of physically bringing the diffusion areas to locate next to each other and having the MOS transistors share their diffusion area or a way of forming in the diffusion areas contacts leading to a metal layer and establishing connection between the diffusion areas with a metal interconnect line, is employed. The latter way, however, has the disadvantage that, since a contact takes up an area that is about two times larger than a gate and a metal interconnect line also occupies a certain area, the cell area inevitably increases. Accordingly, the former way (diffusion area sharing) has been considered a promising technique.

A technique of linear-arranging transistors is disclosed in a report by T. Uehara et al. entitled "Optimal Layout of CMOS Functional Arrays," IEEE Trans. on Computers, Vol. C-30, No. 5, pp. 305–312, May 1981. Referring to FIG. 1A, plural PMOS transistors 21 are arranged in one row and plural NMOS transistors 22 are arranged in one row. Interconnections between PMOS transistors 21 and NMOS transistors 22 are established using channel interconnect lines provided in a routing region. Additionally, in order to increase the number of diffusion shares to a maximum, a graph-theoretical algorithm to determine locations (placement) of transistors is employed. Referring to FIG. 1B, there is shown a preferable example of the transistor placement that human designers can provide. As can be observed from FIG. 1B, transistors of the same type (PMOS) are located next to each other in the vertical direction and, unlike FIG. 1A, there is no one-row placement constraint. Although diffusion area sharing is possible in the FIG. 1B example, transistors are spaced from one another to achieve space-saving cell layout design. This teaches that the maximum diffusion area sharing does not always achieve the minimum cell area.

Conventional approaches of discovering wire routings between components are illustrated. The conventional routing may be divided into two methods, namely the channel routing and the grid routing.

The channel routing uses a channel graph to represent a routing (wiring) region. Wire routings are first determined by graph edge and are found in more detail in a channel. Two or more interconnection layers are used. Basically, vertical wire routings and horizontal wire routings are made on separate interconnection layers. Connection between interconnection layers of different levels is established with the aid of a contact. The channel routing, however, suffers the problem that it requires a great number of contacts. So the channel routing finds it hard to minimize the cell area.

The grid routing, on the other hand, uses a fine grid structure to represent a routing region. Basically, the grid routing searches one interconnection layer for wire routings. When two wire routings are found to cross each other, one of them is transferred to an interconnection layer of the different level through a contact. However, one channel in the channel routing corresponds to at least 100 grids in the grid routing, in some cases, more than 10000 grids. In a conventional grid routing method, there has been the constraint that only one wire routing is allowed to go through each grid edge. In comparison with the channel routing, the conventional grid routing is able to reduce the number of contacts required; however, the grid routing is time consuming because it requires a lot of time for calculation.

Next, layout compaction of the conventional type is explained. The conventional layout compaction is divided into two categories, namely the one-dimensional compaction and the two-dimensional (2D) compaction that is an improvement of the one-dimensional compaction. H. Shin et al. disclose a 2D compaction technique in their report entitled "Two-Dimensional Compaction By 'Zone Refining'," Proc. of 23rd Design Automation Conference, pp. 115–122, 1986. In accordance with this 2D compaction technique, the undermost of groups of components in a cell which are candidates for compaction (i.e. a group of components that is located undermost) is first moved downward and, at the same time, components that belong to the undermost group are given lateral optimum locations and are moved thereinto. Then, such is repeated to the second undermost group and so on. The conventional 2D compaction technique, however, has the disadvantage that the optimality of wire routing may be damaged because of the occurrence of unnecessary bending to wire routings caused by movement of component groups.

SUMMARY OF THE INVENTION

An object of this invention is to provide a technique capable of automatically placing transistors in a cell at the same density level that human designers can achieve.

Another object of this invention is to provide a technique capable of not only designing wire routings on one interconnection layer but also conducting a fast automatic search for optimum wire routings.

Still another object of this invention is to provide a 2D compaction technique without wire routing optimality loss.

In accordance with this invention, based on the netlist, 2D-grouping of transistors is optimized, to increase the number of diffusion shares to a maximum as well as to reduce the cell area to a minimum.

In accordance with this invention, when a wire routing that connects two points by the shortest distance cannot be found on a gridded plane because of existing wiring routings as obstacles, wire routing optimization is performed by taking into account trading-off or balancing of the detour of wire routing and the generation of contact.

In accordance with this invention, optimal 2D compaction is implemented by re-arranging and re-routing transistors during the compaction.

BRIEF DESCRIPTION OF THE DRAWINGS

FIGS. 8A–8E are diagrams each showing a net of FIG. 7B at a different state.

FIGS. 13A–13C show examples of the layout compaction.

DETAILED DESCRIPTION OF THE INVENTION

Figure 1:
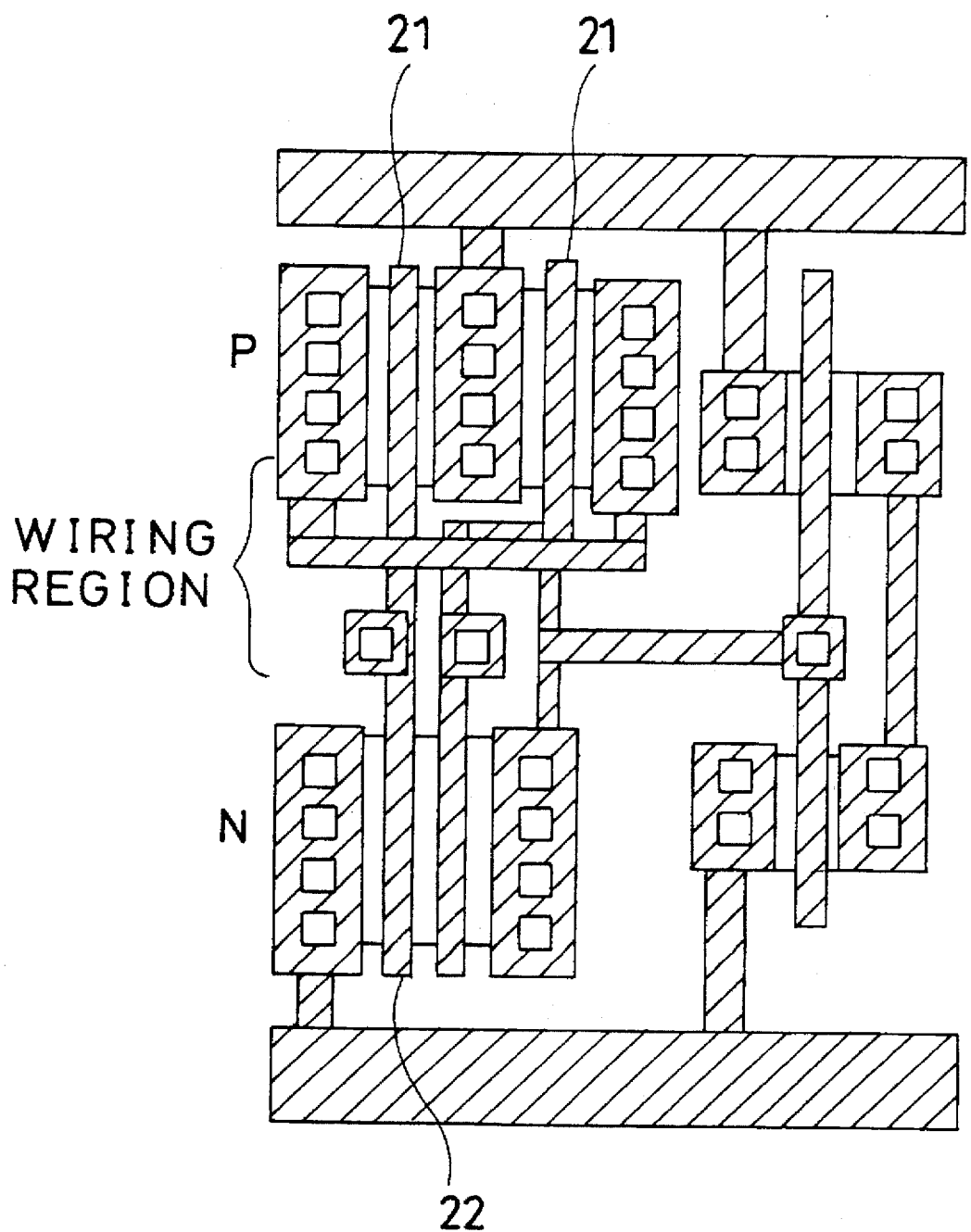
FIG. 1A is an example of the placement of transistors in accordance with a prior art technique.
FIG. 1B is an example of the placement of transistors in accordance with this invention.
Figure 1:
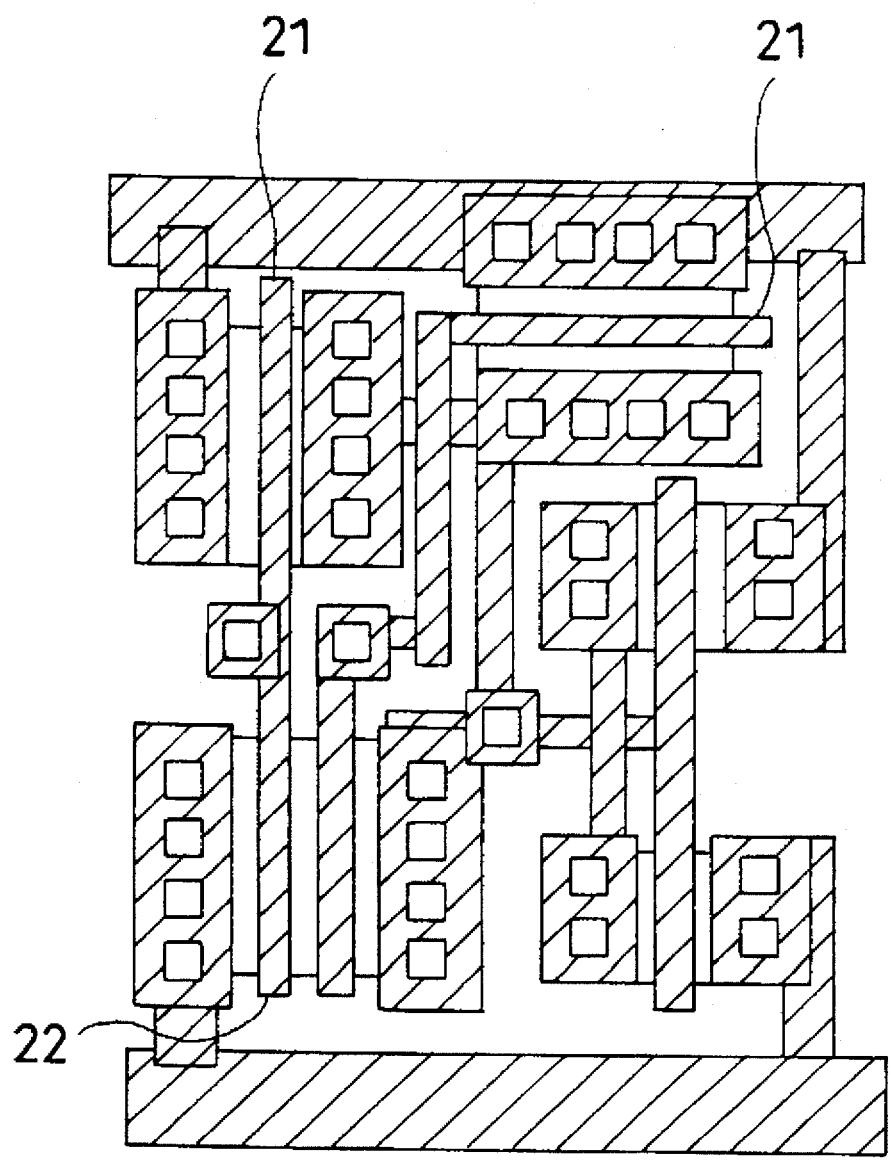
Figure 2:
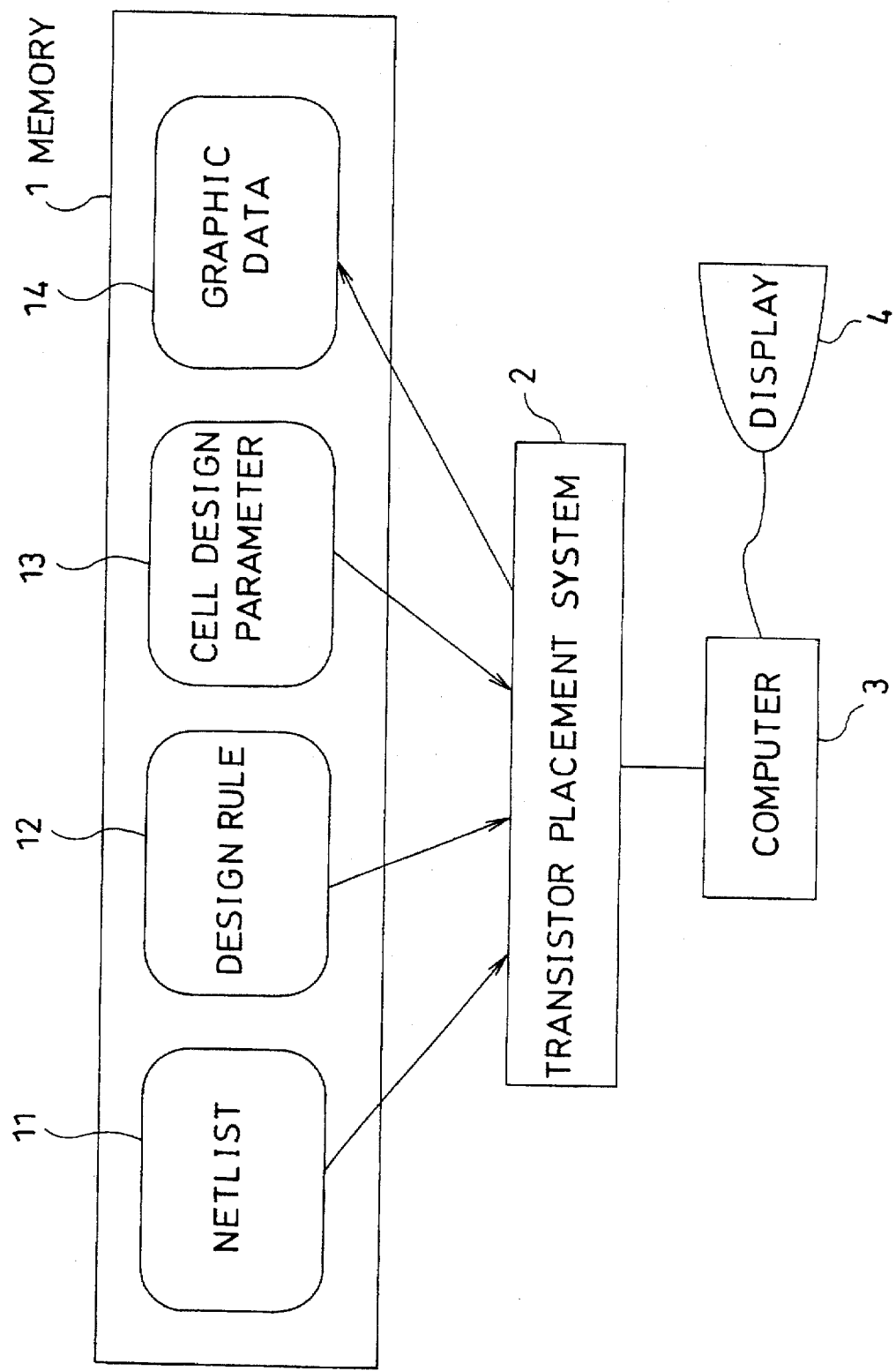
FIG. 2 is a block diagram illustrating an apparatus for designing VLSIs in accordance with this invention.

Referring now to FIG. 2, there is shown in block form an apparatus for the design of VLSIs in accordance with the present invention. This VLSI design apparatus is composed of the following elements: memory 1; transistor placement system (TPS) 2 that generates, based on the data stored in memory 1, information as to transistor placement (i.e., graphic data 14); computer 3 for data transfer and data processing; and display device 4 for display of results of the analysis and processing. TPS 2 receives from memory 1 information containing netlist 11, design rule 12, and cell design parameter 13. Netlist 11 contains information as to connections between gate, source, and drain regions of a transistor, and an external terminal, a power supply line, and a ground line. Graphic data 14, generated by TPS 2, is stored in memory 1. Memory 1 and TPS 2 together form a cell generator of the present invention.

Figure 3:
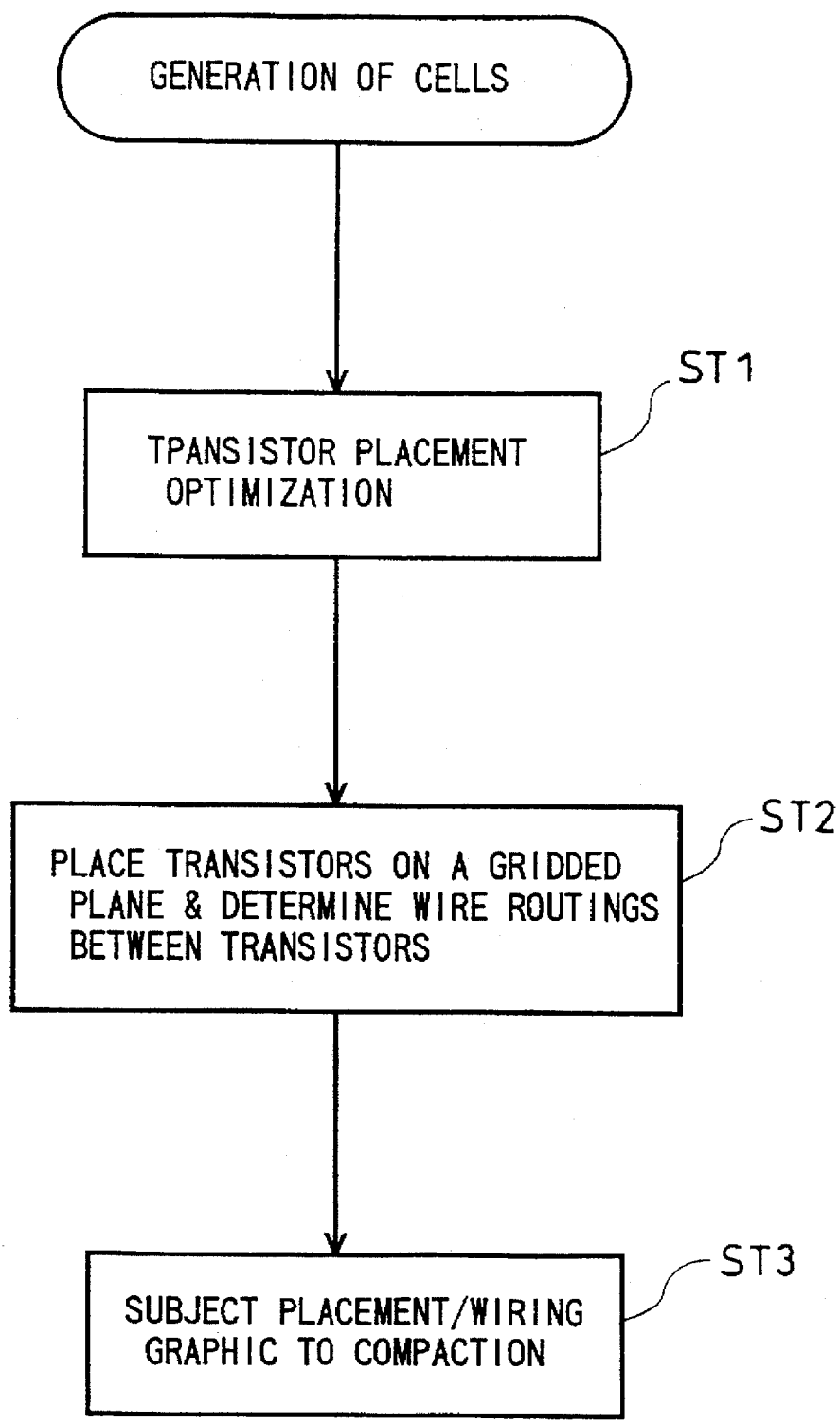
FIG. 3 shows steps of the generation of a cell in accordance with this invention.

Referring now to FIG. 3, there is shown a cell-layout determining procedure by the cell generator. At step ST1, optimum locations of transistors are determined. At step ST2, the transistors are placed on a gridded plane and wire routings between the transistors are found on the gridded plane. At step ST3, layout compaction is carried out. These steps are described in detail below.

DETERMINATION OF TRANSISTOR PLACEMENT

Figure 4:
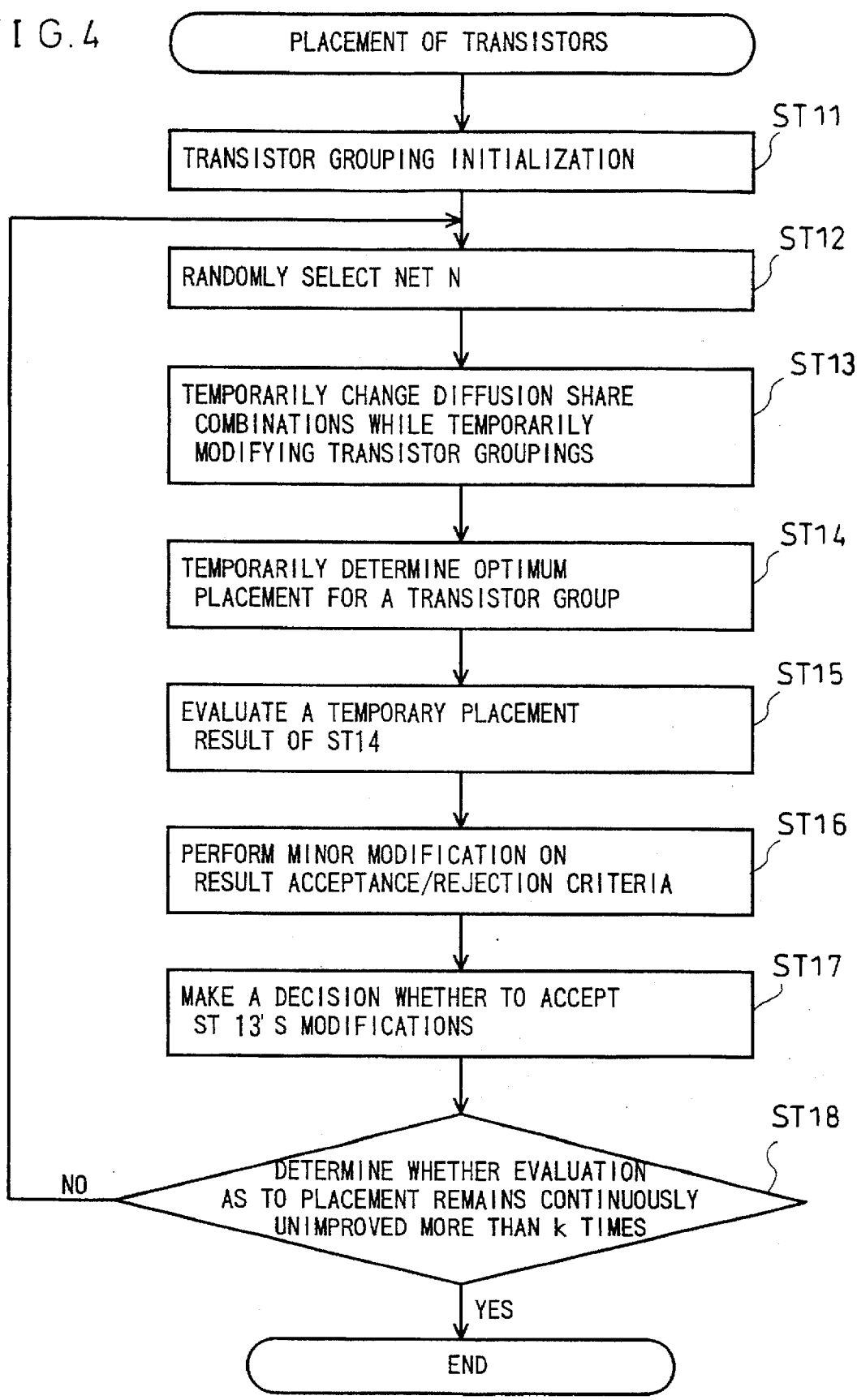
FIG. 4 shows in detail steps of the placement of transistors in accordance with this invention.
Figure 5:
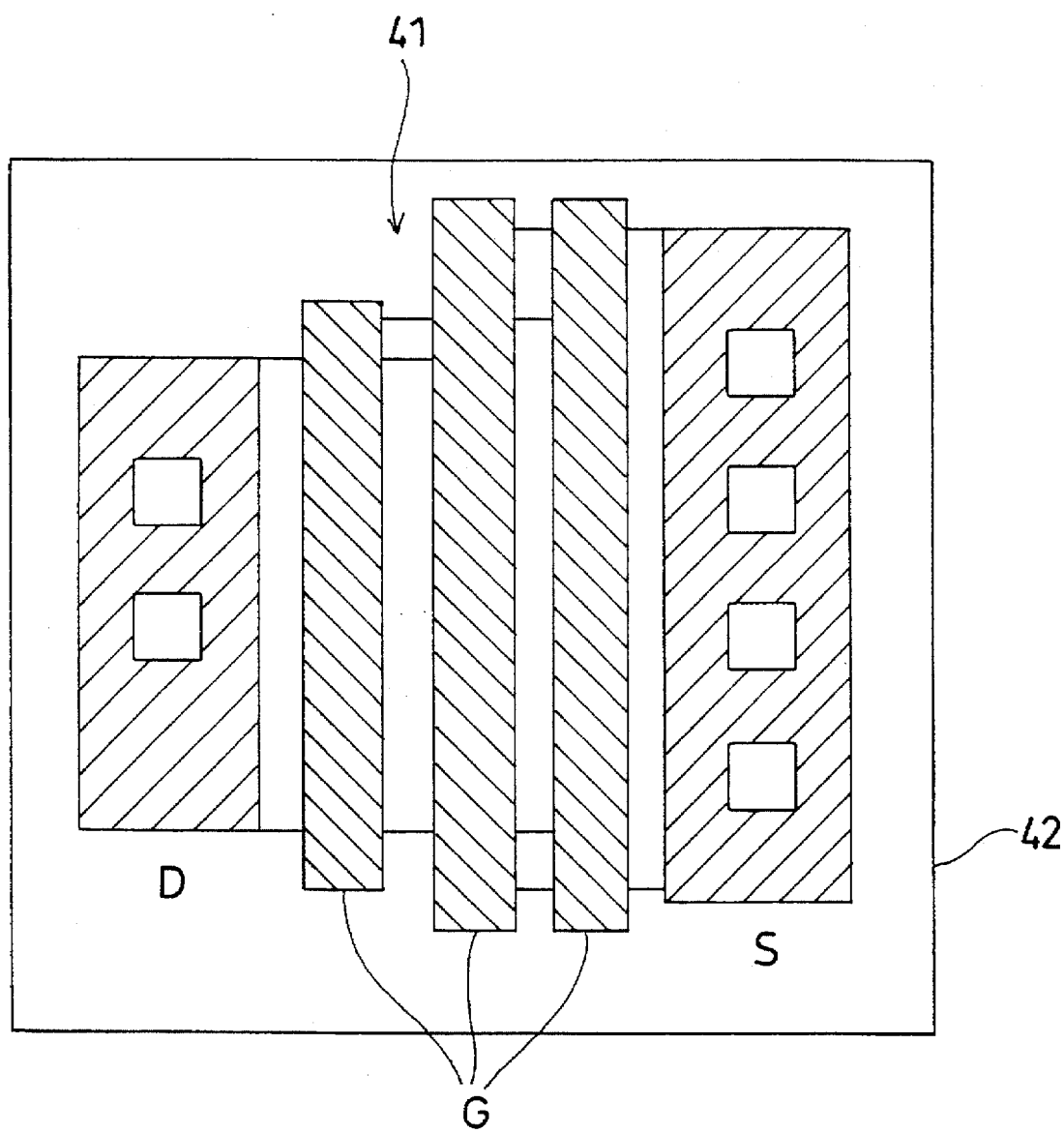
FIG. 5 depicts an example of the abstraction of a rectangle representing one group of transistors.

Referring to FIG. 4, step ST1 of FIG. 3 is detailed in detail. At step ST11, transistor grouping arranged in accordance with diffusion sharing is initialized. Rectangle 42 shown in FIG. 5 is an abstraction of one group of transistors. Rectangle 42 contains three diffusion sharing transistors 41. The height of rectangle 42 is determined according to the height of the highest of transistors 41.

Figure 6A:
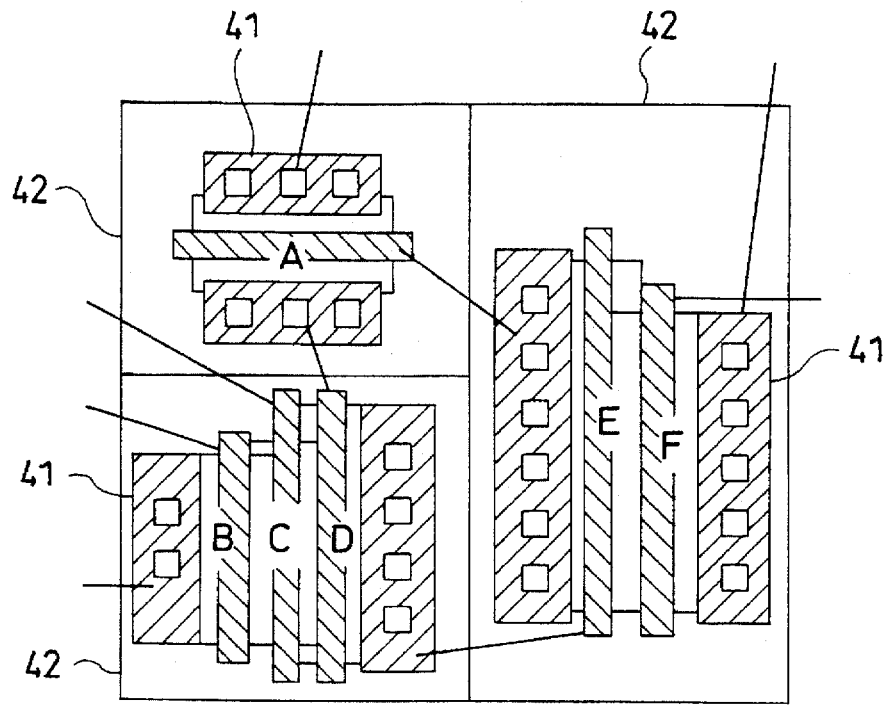
FIG. 6A depicts an example of the cell slicing structure.
Figure 6B:
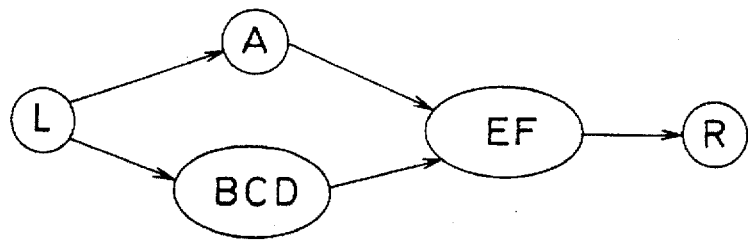
FIG. 6B is a horizontal placement graph corresponding to FIG. 6A, or an x-graph.
Figure 6C:
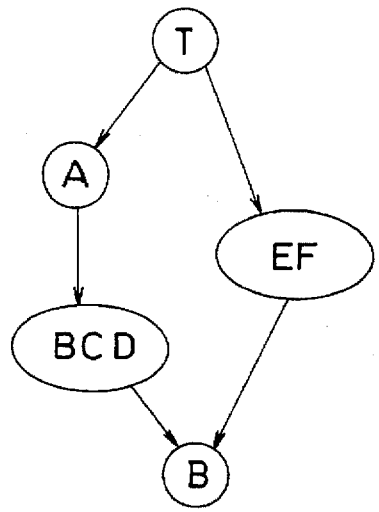
FIG. 6C is a vertical placement graph corresponding to FIG. 6A, or a y-graph.

This invention uses a cell slicing structure made up of a plurality of rectangular abstractions (see FIG. 6A). The cell height is represented by the longest of paths in a horizontal placement graph and the cell width is represented by the longest of paths in a vertical placement graph. FIG. 6B is an example of the horizontal placement graph. FIG. 6C is an example of the vertical placement graph. In this invention, it is arranged such that the entire diffusion sharing state changes with the local grouping state. A greedy technique is used when finding in the same grouping the most suitable slicing structure.

This invention aims at finding not only optimum grouping based on the transistor diffusion sharing but also an optimum slicing structure. In the present embodiment, simulated annealing is used at step ST16 of FIG. 4, to search for an optimum grouping of transistors. An example of the simulated annealing is shown by S. Kirkpatrick, et al. in their report entitled "Optimization by Simulated Annealing," Science, Vol. 220, No. 4598. pp. 671–680, May 1983. This simulated annealing is implemented by repeatedly performing steps of (a) making a local change in the state (steps ST12–ST14 of FIG. 4), (b) evaluating a result of step (a) (step ST15). and (c) making a probabilistic judgment of whether to accept the result. This simulated annealing is characterized by its criterion scheduling. It is, however, to be noted that the present invention does not necessarily depend upon such scheduling. For example, at step ST16, the criterion is greedily fixed such that the act of acceptance is made, only when a better score is expected.

Figure 7A:
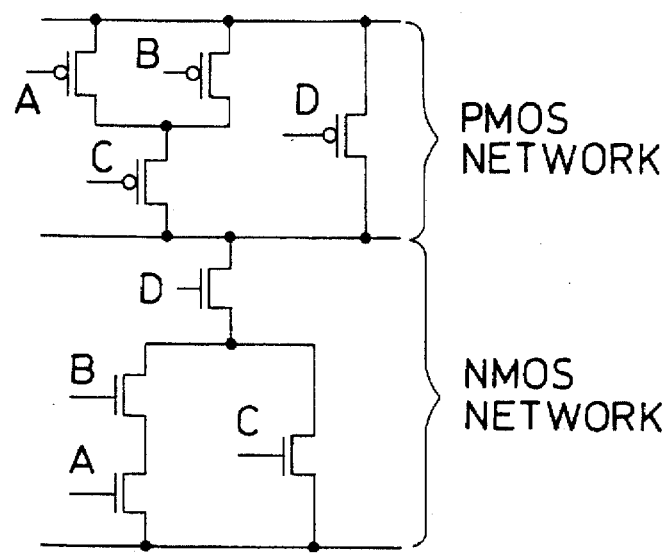
FIG. 7A shows an example of the transistor circuit.
Figure 7B:
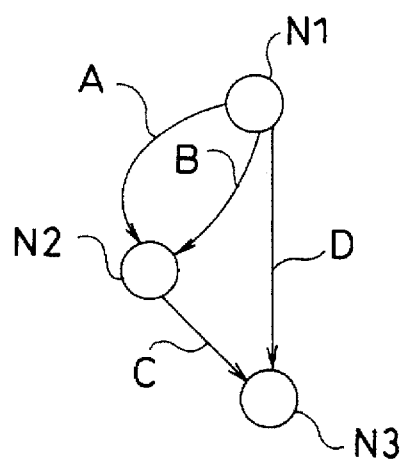
FIG. 7B is a graph representing a PMOS network of FIG. 7A.
Figure 7C:
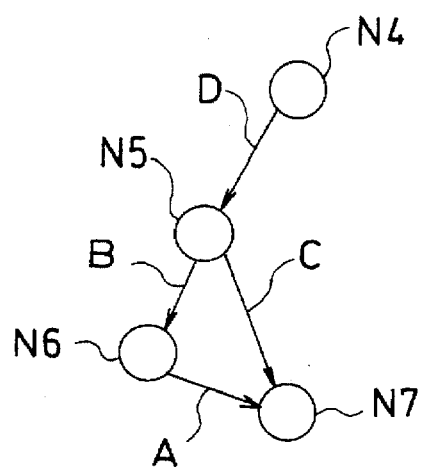
FIG. 7C is a graph representing an NMOS network of FIG. 7A.

Suppose netlist 11 represents a CMOS transistor circuit of FIG. 7A. Graph edges A, B, C, and D of FIG. 7B correspond transistors A, B, C, and D of the first type, respectively. Graph edges A, B, C, and D of FIG. 7C correspond transistors A, B, C, and D of the second type, respectively. Graph vertexes N1–N7 correspond to nets of FIG. 7A. Each graph vertex has a transistor share state. For example, graph vertex N2 of FIG. 7B has five different transistor share states (see FIGS. 8A–8E). FIG. 8B represents that, at net N2, transistors A and B are diffusion-shared while transistor C does not share a diffusion area with any other transistors.

Figure 9A:
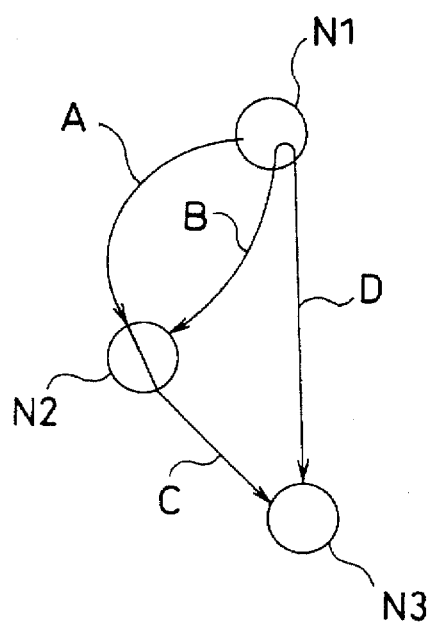
FIG. 9A is an option of the FIG. 7B graph.
Figure 9B:
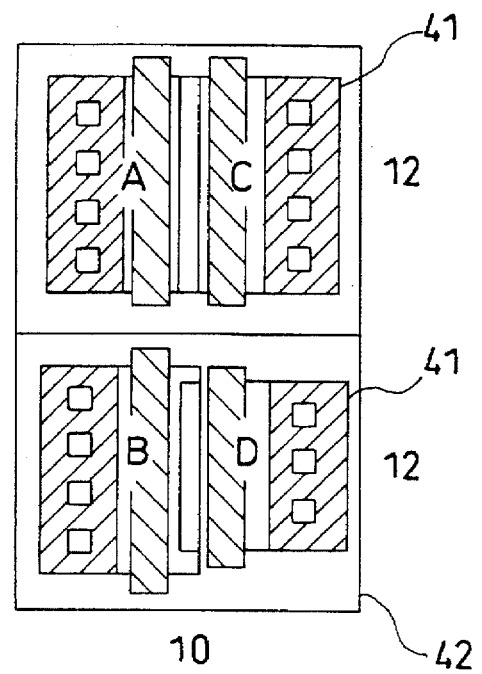
FIG. 9B shows the placement of transistors corresponding to FIG. 9A.
Figure 9C:
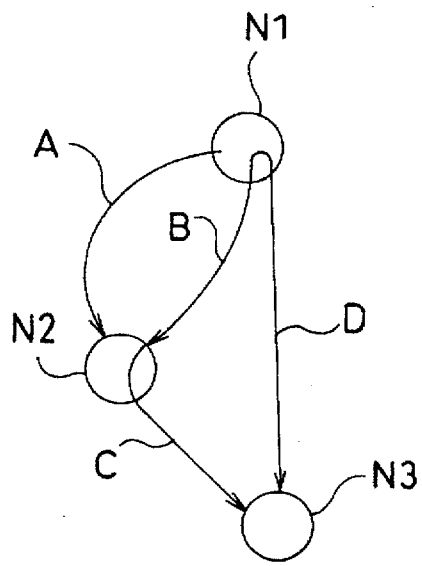
FIG. 9C is another option of the FIG. 7B graph.
Figure 9D:
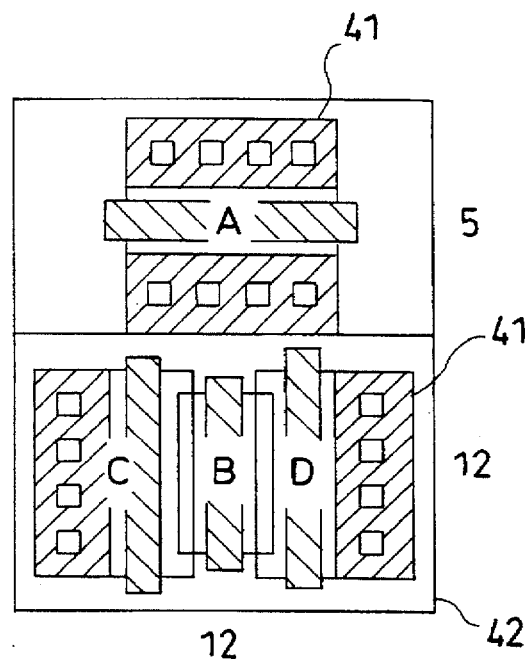
FIG. 9D is the placement of transistors corresponding to FIG. 9C.

FIGS. 9A and 9C show changes in the state of graph vertex N2. When graph vertex N2 makes a change in the state from FIG. 8C to FIG. 8D, transistor grouping likewise changes from FIG. 9B to FIG. 9D and a search for an optimum slicing structures is conducted. The value of the simulated annealing's cost function is cell height-dependent. This cost function adds a penalty when a cell height pre-computed exceeds a limit. In this embodiment, a penalty of 100 is awarded. If the limit of height is 25, then 250 is a cost value of FIG. 9B and 300 is a cost value of FIG. 9D. The FIG. 9B transistor placement is used accordingly. If the limit of height is 20, then 300 is a cost value of FIG. 9B and 240 is a cost value of FIG. 9D. In this case, the FIG. 9D transistor placement is used.

The present embodiment achieves 2D transistor grouping optimization that makes it possible to place transistors at the same density level that human designers can achieve.

PLACEMENT/ROUTING ON GRIDDED PLANE

Figure 10:
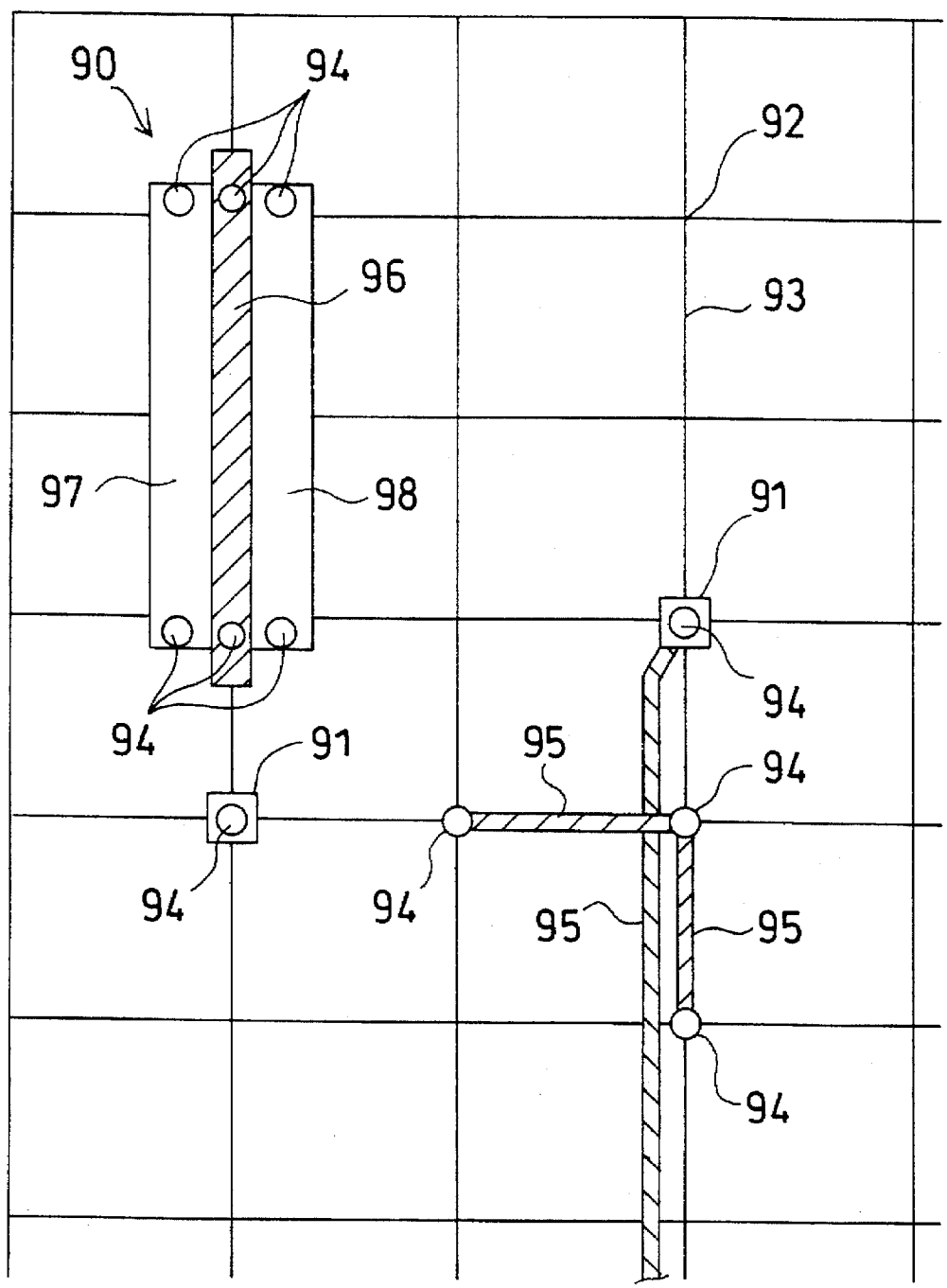
FIG. 10 is a diagram illustrating a grid structure for use in finding wire routings in accordance with this invention.

Step ST2 of FIG. 3 is explained in detail. Referring first to FIG. 10, a grid structure of the present invention is illustrated. Transistor 90 or pin 91 may be placed at grid vertex 92. If the width of a transistor 90 exceeds a unit length of the grid, then the transistor 90 takes up a plurality of grid vertexes 92. Transistor 90 is provided with gate 96, source 97 and drain 98. Each of gate 96, source 97 and drain 98 has wire joints 94 and each wire joint 94 is allocated to a respective grid vertex 92 where the transistor 90 is placed. Likewise, pin 91 takes up one or more grid vertexes 92 and wire joints 94 are allocated to individual grid vertexes 92. According to netlist 11 of FIG. 2, each wire joint 94 is assigned a net number or a net name (a net is a cluster of wire joints to be connected to the same potential). Further, in order to establish connection between wire joints 94, wire segment 95 is arranged on grid edge 93. When a plurality of wire segments 95 are allocated onto the same grid edge 93, wire segments 95 are horizontally or vertically ordered. This may be implemented by a simple way in which wire segments 95 are assigned their respective significance variables, in other words, a wire segment 95 that is the most significant is placed undermost or leftmost while on the other hand a wire segment 95 that is the least significant is placed uppermost or rightmost.

Next, routing over the FIG. 10 grid structure is illustrated. This routing process is divided into two sub-processes, the initial routing and the re-routing for re-routing certain nets. The initial routing and the re-routing are shown below.

1. Initial Routing

Step S1: Determine the order of nets to be dealt with.
  Step S2: Perform steps S3 and S4 on each net in the determined order.
  Step S3: Determine the order of wire joints to be dealt with.
  Step S4: Sequentially find a wire routing from an unwired wire joint towards an existing wire routing.

2. Re-Routing

Step T1: Remove every wire routing of a net given.
  Step T2: Perform steps S3 and S4 on the net.

Figure 11A:
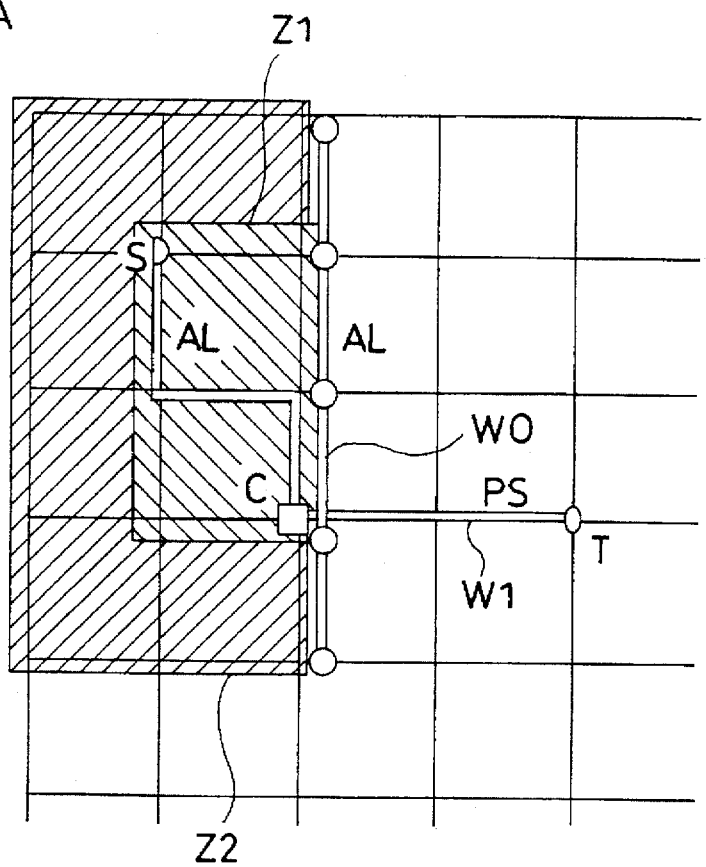
FIG. 11A shows an example of the wire routing search in accordance with this invention.

At step S4, while bypassing existing wire routings, a shortest route is found on one interconnection layer. If, in FIG. 11A, S is the starting point and T is the target point, then the shortest distance is a length of 5 that is five times the grid unit length. However, a wire routing, WO, already exists as an obstacle, so that a contact must be generated in order to achieve a wire routing having a length of 5. Generating a contact increases the cell area and, likewise, making a detour increases the cell area. Therefore, the trading-off between the contact generation and the detour is important. In the present invention, a detour distance equivalent to generation of one contact is given.

In accordance with the present invention, the shortest distance to a target point is set as an initial target wire routing length and the search for a wire routing having a length equal to the initial target wire routing length is conducted. If the search fails to find such a wire routing, then the target wire routing length is incremented by one, in other words the search range is expanded to permit a 1-distance detour. If the distance of detour exceeds a distance equivalent to generation of one contact, then one contact is generated to discover a wire routing that jumps over an existing wire routing. Note that, when a wire routing goes through a contact, a detour distance equivalent to generation of the contact is added to the length of the wire routing. More specifically, in the FIG. 11A example, a detour distance equivalent to generating one contact is a distance of 2. The initial target wire routing length is a length of 5. Z1 is the search area of a detour distance of zero and Z2 is the search area of a detour distance of up to 2. Because of the existence of WO, it is not until the search area is expanded to Z2 that a wire routing reaching T is discovered. So contact C is generated, whereupon a wire routing W1 is found. W1 including a 3-distance wire segment formed on an interconnection layer of aluminum and a 2-distance wire segment formed on an interconnection layer of polysilicon.

Figure 11B:
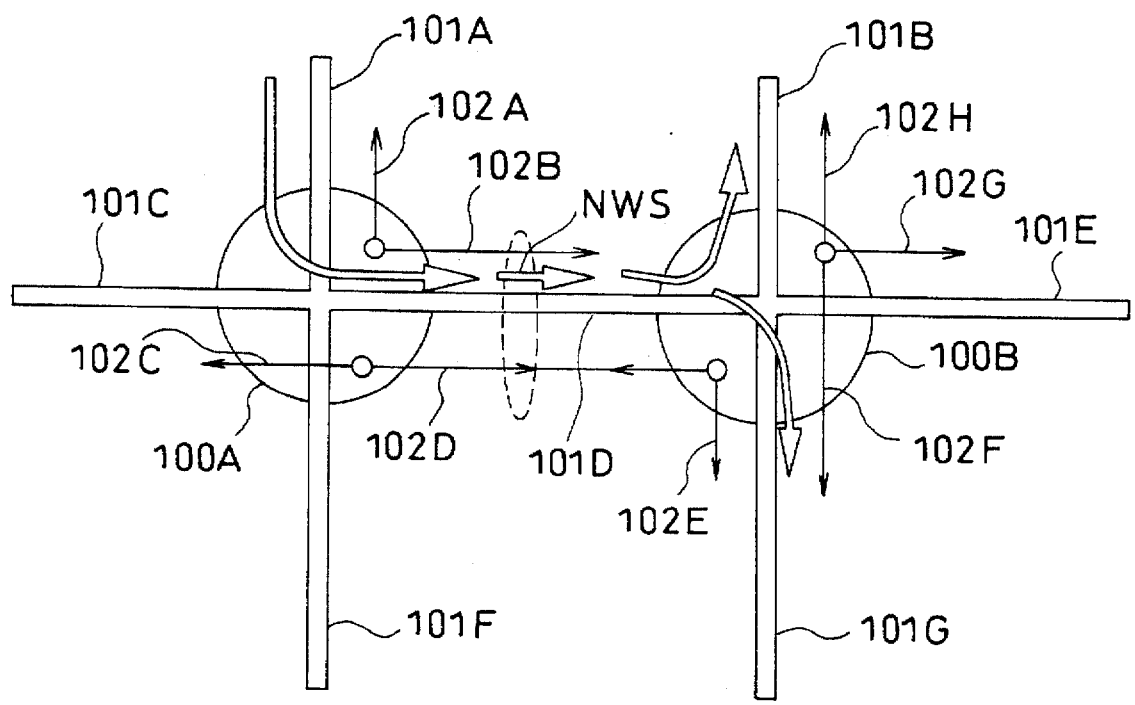
FIG. 11B shows another example of the wire routing search in accordance with this invention.

Referring to FIG. 11B, the search for a grid vertex that can be reached from a neighboring grid vertex is described. 100A and 100B are grid vertexes. 101A–101G are grid edges. 102A–102H are wire segments of existing wirer routings. With respect to an interconnection line that is placed on the left side of wire segment 102A, a wire segment is added to grid edge 101A and a constraint of placing such a new wire segment on the left sled of wire segment 102 is given. Additionally, a new wire joint is added to grid vertex 100A. When trying to extend an interconnection line from the added wire joint, the existence of wire segments 102C and 102D prevents the interconnection line from going downward, in other words the interconnection line is allowed to move in the horizontal direction only and is extended to the right here. At this time, a new wire segment, NWS, is added to grid edge 101D. As a result, wire segment NWS, wire segment 102B, wire segment 102D are placed on grid edge 101D. A constraint that wire segment 102B, wire segment NWS, and wire segment 102D are placed in that order from above, is given. Additionally, a new wire joint is added to grid vertex 100B. When trying to extend an interconnection line from the added wire joint the existence of wire segments 102F and 102H prevents the interconnection line from going to the right and the interconnection line is extended upward or downward here. As described above, the order of placing wire segments at each grid edge is given and the direction of the search for a new wire routing is decided.

2D COMPACTION

Figure 12:
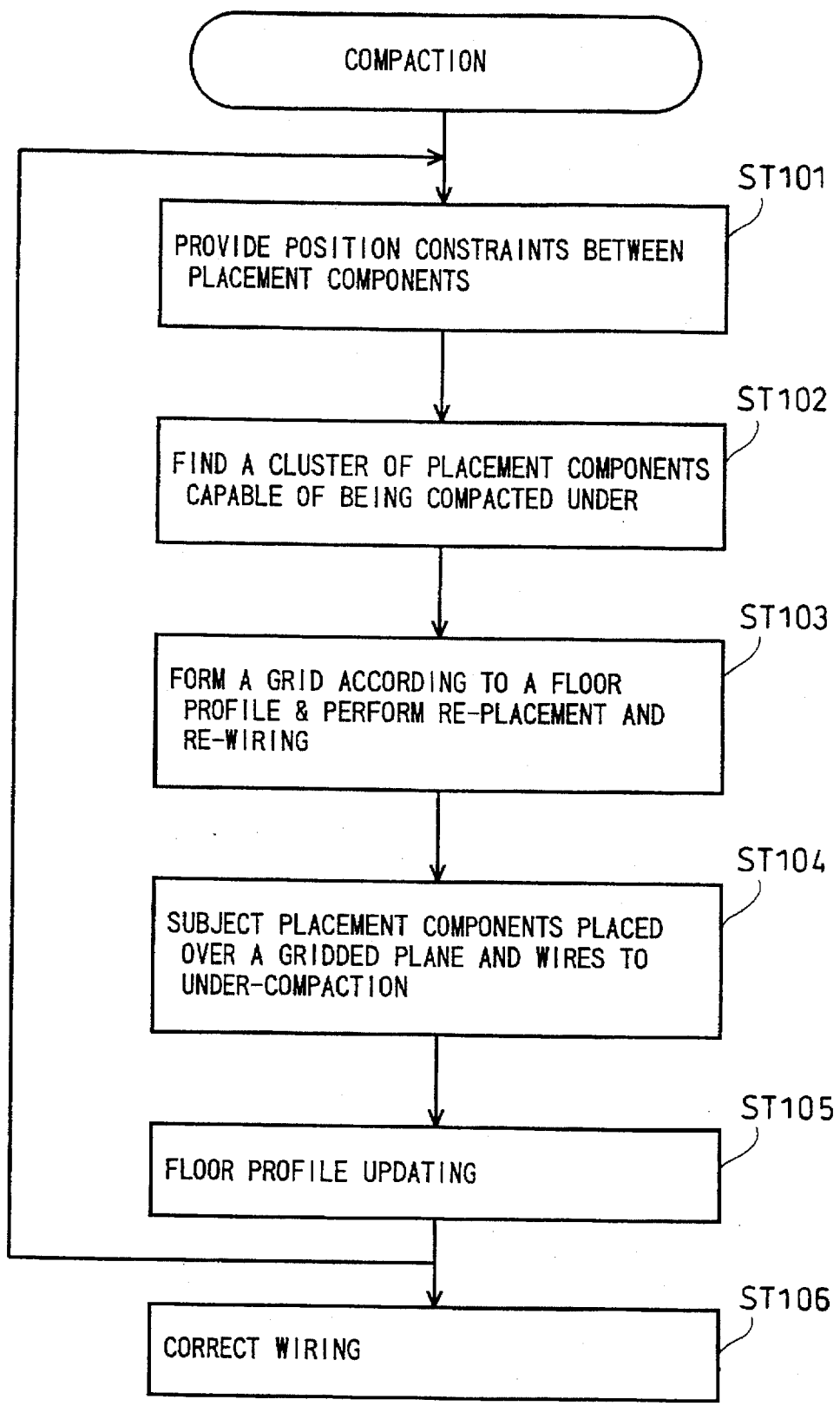
FIG. 12 shows steps of the layout compaction in accordance with this invention.

FIG. 12 is a flow diagram illustrating in detail step ST3 of FIG. 3. FIGS. 13A–13C illustrate examples of compaction.

At step ST101 of FIG. 12, an x-graph and a y-graph are prepared to represent location constraints between placement components. FIG. 13A depicts a standard cell which is placed such that both power supply line 121 and ground line 122 orient in the vertical direction and which is still under compaction. Transistor 123D, transistor 123E, and pin 124 are placement components whose locations have already been fixed, and floor profile 125 is fixed. On the other hand, transistors 123A, 123B, 123C are components whose locations have not been fixed yet and which are candidates for downward compaction, and ceiling profile 126 is schematically illustrated. FIG. 13A shows an example of the y-graph prepared. Graph vertexes 128A–128E of FIG. 13C correspond to transistors 123A–123E of FIG. 13A. Each graph edge of FIG. 13C is assigned design rules signifying vertical position constraints, as the weight. At step ST102, the y-graph is searched to find a cluster of placement components having no graph edges bound for graph vertexes corresponding to placement components that have not been placed yet, i.e., an under-pack group G formed of components capable of being placed undermost. Referring to FIG. 13C, three graph vertexes, namely graph vertex 128A, graph vertex 128B, and graph vertex 128C, constitute an under-pack group G. At step ST103, as shown in FIG. 13B, gridded plane 127 is formed along floor profile 125. The spacing between each grid of gridded plane 127 is not constant. Each of placement components forming an under-pack group G is shifted on gridded plane 127 according to the cell area minimization evaluation index, in order that the placement components are packed as low as possible. Next, based on the wire length minimization and contact count minimization evaluation indexes, re-routing between placement components of group G is performed. At step ST104, gridded plane 127 is removed and compaction is carried out to obtain a final graphic of the wiring. In other words, of a horizontal region available for component placement given by the x-graph a location at which each placement component can be placed as deep as possible is selected according to floor profile 125. If results of the evaluation are the same, then a location closer to the both ends is selected. At step ST105, updating of floor profile 12S is carried out to reflect the result of the compaction. If there is a component that has not been placed yet, then steps ST101–ST105 are repeated. At step ST106, every wire segment is examined and excess bends in the wiring are removed to such an extent that the cell area does not increase.

As described above, in the 2D compaction according to the present invention, gridded plane 127 is temporarily formed in accordance with floor profile 125, and a placement component is shifted over gridded plane 127 to an optimum location, and local re-routing between each component placed on gridded plane 127 is performed to eliminate the problem that excess bends are created in the wiring.

The invention claimed is:

1. A method of generating cells for a semiconductor integrated circuit, said method comprising the steps of:
   (a) determining locations of transistors in a cell;
   (b) finding wire routings between said transistors on a gridded plane; and
   (c) performing a compaction process on a placement/wiring result on said gridded plane;
   said step (a) including:
   (a-1) initializing a grouping of transistors, said grouping being arranged in accordance with diffusion sharing;
   (a-2) modifying said grouping;
   (a-3) finding locations of transistors in said modified grouping;
   (a-4) evaluating said locations found at said step (a-3); and
   (a-5) making a judgment of whether to accept said locations found at said step (a-3) according to said evaluation made at said step (a-4).

2. The method of generating cells according to claim 1 wherein said grouping is represented with a graph in which transistors correspond to respective graph edges and nets correspond to respective graph vertexes and wherein at least one of said graph vertexes has a share state of a transistor in a corresponding net.

3. A semiconductor integrated circuit arranged with densely-packed leaf cells comprising:
   a plurality of transistors adjacent to each other in a vertical direction, wherein said plurality of transistors are spaced apart from one another to achieve a space-saving cell layout design and arranged in groupings to provide a diffusion sharing;
   a plurality of vertical and horizontal wire routing regions located between said transistors comprising channel graphs thereby forming a gridded plane, said vertical and horizontal wire routing regions comprising laminated interconnection layers; and
   a plurality of contacts connecting said interconnection layers.

4. A method of generating cells for a semiconductor integrated circuit, said method comprising the steps of:
   (a) determining locations of transistors in a cell;
   (b) finding wire routings between said transistors on a gridded plane; and
   (c) performing a compaction process on a placement/wiring result on said gridded plane;
   said step (b) including:
   (b-1) arranging a grid structure having a plurality of grid vertexes and a plurality of grid edges;
   (b-2) giving a detour wire routing length equivalent to generation of one contact;
   (b-3) finding a shortest distance from a starting point located at each said grid vertex to a target point;
   (b-4) initializing a detour distance to zero;
   (b-5) when no wire routings are found within a wire routing length range defined by a sum of said shortest distance and said detour distance, increasing said detour distance by one and searching an interconnection layer for a wire routing which goes through some of said plurality of grid edges from said starting point to said target point and which goes around an existing interconnection line; and
   (b-6) when said increased detour distance exceeds said given detour wire routing length, generating one contact and searching a different interconnection layer for a wire routing which goes through some of said plurality of grid edges from said starting point to said target point and which jumps over said existing interconnection line.

5. The method of generating cells according to claim 4 additionally comprising giving order constraints to a plurality of wire segments placed on the same grid edge.

6. A semiconductor integrated circuit arranged with densely-packed leaf cells comprising:
   a plurality of transistors adjacent to each other in a vertical direction, wherein said plurality of transistors are spaced apart from one another to achieve a space-saving cell layout design and arranged in groupings to provide a diffusion sharing;
   a plurality of vertical and horizontal wire routing regions located between said transistors comprising channel graphs thereby forming a gridded plane, said vertical and horizontal wire routing regions comprising laminated interconnection layers;
   a plurality of contacts connecting said interconnection layers; and
   a detour wire having a routing length to provide a contact disposed between said routing regions, wherein said groupings are arranged in a graph in which said transistors correspond to respective graph edges, wherein nets correspond to respective graph vertexes, and wherein at least one of said graph vertexes has a share state of a transistor in a corresponding net.

7. A method of generating cells for a semiconductor integrated circuit, said method comprising the steps of:
(a) determining locations of transistors in a cell;
(b) finding wire routings between said transistors on a gridded plane; and
(c) performing a compaction process on a placement/wiring result on said gridded plane;
said step (c) including:
(c-1) assigning inter-transistor position constraints;
(c-2) finding, based on said position constraints, a cluster of transistors capable of being under-packed;
(c-3) arranging a gridded plane to supreme forms of existing placement components;
(c-4) shifting each transistor belonging to said cluster on said gridded plane such that each said transistor is underpacked as low as possible;
(c-5) re-routing said transistors belonging to said cluster on said gridded plane; and
(c-6) under-packing said transistors belonging to said cluster and interconnection lines thereof such that said transistors and said interconnection lines are under-packed as low as possible towards said existing placement components.

8. A semiconductor integrated circuit arranged with densely-packed leaf cells comprising:
a plurality of transistors adjacent to each other in a vertical direction, wherein said plurality of transistors are spaced apart from one another to achieve a space-saving cell layout design and arranged in groupings to provide a diffusion sharing;
a plurality of vertical and horizontal wire routing regions located between said transistors comprising channel graphs thereby forming a gridded plane, said vertical and horizontal wire routing regions comprising laminated interconnection layers;
a plurality of contacts connecting said interconnection layers; and
a cluster of transistors comprising a plurality of said plurality of transistors, wherein each transistor in a cluster of transistors is underpacked as low as possible.

9. An apparatus for generating cells for a semiconductor integrated circuit, said apparatus comprising:
(a) means for determining locations of transistors in a cell;
(b) means for finding wire routings between said transistors on a gridded plane; and
(c) means for performing a compaction process on a placement/wiring result on said gridded plane;
said means (a) including:
(a-1) means for initializing a grouping of transistors, said grouping being arranged in accordance with diffusion sharing;
(a-2) means for modifying said grouping;
(a-3) means for finding locations of transistors in said modified grouping;
(a-4) means for evaluating said locations found by said means (a-3); and
(a-5) means for making a judgment of whether to accept said locations found by said means (a-3) according to said evaluation made by said means (a-4).

10. An apparatus for generating cells for a semiconductor integrated circuit, said apparatus comprising:
(a) means for determining locations of transistors in a cell;
(b) means for finding wire routings between said transistors on a gridded plane; and
(c) means for performing a compaction process on a placement/wiring result on said gridded plane;
said means (b) including:
(b-1) means for arranging a grid structure having a plurality of grid vertexes and a plurality of grid edges;
(b-2) means for giving a detour wire routing length equivalent to generation of one contact;
(b-3) means for finding a shortest distance from a starting point located at each said grid vertex to a target point;
(b-4) means for initializing a detour distance to zero;
(b-5) means for, when no wire routings are found within a wire routing length range defined by a sum of said shortest distance and said detour distance, increasing said detour distance by one and searching an interconnection layer for a wire routing which goes through some of said plurality of grid edges from said starting point to said target point and which goes around an existing interconnection line; and
(b-6) means for, when said increased detour distance exceeds said given detour wire routing length, generating one contact and searching a different interconnection layer for a wire routing which goes through some of said plurality of grid edges from said starting point to said target point and which jumps over said existing interconnection line.

11. An apparatus for generating cells for a semiconductor integrated circuit, said apparatus comprising:
(a) means for determining locations of transistors in a cell;
(b) means for finding wire routings between said transistors on a gridded plane; and
(c) means for performing a compaction process on a placement/wiring result on said gridded plane;
said means (c) including:
(c-1) means for assigning inter-transistor position constraints;
(c-2) means for finding, based on said position constraints, a cluster of transistors capable of being under-packed;
(c-3) means for arranging a gridded plane to supreme forms of existing placement components;
(c-4) means for shifting each transistor belonging to said cluster on said gridded plane such that each said transistor is under-packed as low as possible;
(c-5) means for re-routing said transistors belonging to said cluster on said gridded plane; and
(c-6) means for under-packing said transistors belonging to said cluster and interconnection lines thereof such that said transistors and said interconnection lines are under-packed as low as possible towards said existing placement components.

12. A method of determining locations of transistors in a cell for a semiconductor integrated circuit, said method comprising the steps of:
(a) initializing a grouping of transistors, said grouping being arranged in accordance with diffusion sharing;
(b) modifying said grouping;
(c) finding locations of transistors in said modified grouping;

(d) evaluating said locations found at said step (c); and (e) making a judgment of whether to accept said locations found at said step (c) according to said evaluation made at said step (d).

13. The method according to claim 12 wherein said grouping is represented with a graph in which transistors correspond to respective graph edges and nets correspond to respective graph vertexes and wherein at least one of said graph vertexes has a share state of a transistor in a corresponding net.

14. A method of finding a wire routing in a semiconductor integrated circuit, said method comprising the steps of:

(a) arranging a grid structure having a plurality of grid vertexes and a plurality of grid edges;

(b) giving a detour wire routing length equivalent to generation of one contact;

(c) finding a shortest distance from a starting point located at each said grid vertex to a target point;

(d) initializing a detour distance to zero;

(e) when no wire routings are found within a wire routing length range defined by a sum of said shortest distance and said detour distance, increasing said detour distance by one and searching an interconnection layer for a wire routing which goes through some of said plurality of grid edges from said starting point to said target point and which goes around an existing interconnection line; and (f) when said increased detour distance exceeds said given detour wire routing length, generating one contact and searching a different interconnection layer for a wire routing which goes through some of said plurality of grid edges from said starting point to said target point and which jumps over said existing interconnection line.

15. The method according to claim 14 additionally comprising giving order constraints to a plurality of wire segments on the same grid edge.

16. A method of performing compaction for semiconductor integrated circuits, said method comprising the steps of:

(a) assigning inter-placement component position constraints;

(b) finding, based on said position constraints, a cluster of placement components capable of being under-packed;

(c) arranging a gridded plane to the supreme form of existing placement components;

(d) shifting each placement component belonging to said cluster on said gridded plane such that each said placement component is under-packed as low as possible;

(e) re-routing said placement components belonging to said cluster on said gridded plane; and (f) under-packing said placement components belonging to said cluster and interconnection lines thereof such that said placement components and said interconnection lines are under-packed as low as possible towards said existing placement components.

* * * * *